United States Patent
Hetzler

(10) Patent No.: US 9,435,832 B2
(45) Date of Patent: *Sep. 6, 2016

(54) ELECTRONIC COMPONENT, IN PARTICULAR CURRENT SENSOR

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co. KG, Dillenburg (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/016,969

(22) Filed: Feb. 5, 2016

(65) Prior Publication Data

US 2016/0154035 A1    Jun. 2, 2016

Related U.S. Application Data

(63) Continuation of application No. 13/582,188, filed as application No. PCT/EP2011/000170 on Jan. 17, 2011, now Pat. No. 9,255,946.

(30) Foreign Application Priority Data

Mar. 2, 2010 (DE) .................... 10 2010 009 835

(51) Int. Cl.
*G01R 1/44* (2006.01)
*G01R 19/00* (2006.01)
(Continued)

(52) U.S. Cl.
CPC ............. *G01R 19/0092* (2013.01); *G01K 7/02* (2013.01); *G01R 1/203* (2013.01); *G01R 19/03* (2013.01);
(Continued)

(58) Field of Classification Search
CPC .. G01R 19/00; G01R 19/03; G01R 19/0092; G01R 19/225; G01R 1/203; G01R 21/02; G01R 11/185; G01R 5/22

USPC ...... 374/1, 29, 141, 170, 179–185; 324/126, 324/104–106
See application file for complete search history.

(56) References Cited

U.S. PATENT DOCUMENTS 1,407,147 A    2/1922    Goodwin, Jr.
3,026,363 A    3/1962    Batteau
(Continued)

FOREIGN PATENT DOCUMENTS

DE            4243349 A1    6/1994
DE       202006003595 U1    6/2006
(Continued)

OTHER PUBLICATIONS

English-language abstract for DE 20 2006 003 595 U1.
(Continued)

*Primary Examiner* — Lisa Caputo
*Assistant Examiner* — Jonathan Dunlap
(74) *Attorney, Agent, or Firm* — Caesar Rivise, PC

(57) ABSTRACT

The invention relates to an electronic component (1), in particular a current sensor, having a resistance element (5) made of a resistance material, a first connection part (3) made of a conductor material for introducing an electrical current into the resistance element (5), and a second connection part (4) made of a conductor material for discharging the electrical current from the resistance element (5). According to the invention, the component (1) has a temperature-measuring device (8) for measuring a temperature difference between the resistance element (5), on the one hand, and at least one of the two connection parts (3, 4), on the other hand, in order to derive the current from the temperature difference.

21 Claims, 4 Drawing Sheets

(51) Int. Cl.
  *G01R 1/20* (2006.01)
  *G01R 19/03* (2006.01)
  *G01K 7/02* (2006.01)
  *G01R 5/22* (2006.01)
  *G01R 19/22* (2006.01)
  *G01R 11/185* (2006.01)
  *G01R 21/02* (2006.01)

(52) U.S. Cl.
  CPC ............... *G01R 5/22* (2013.01); *G01R 11/185* (2013.01); *G01R 19/00* (2013.01); *G01R 19/225* (2013.01); *G01R 21/02* (2013.01)

(56) References Cited

U.S. PATENT DOCUMENTS

| | | |
|---|---|---|
| 3,477,880 A | 11/1969 | Gay |
| 6,121,766 A | 9/2000 | Beardmore |
| 6,639,395 B2 | 10/2003 | Male |
| 7,292,022 B2 | 11/2007 | Hirasawa |
| 7,994,798 B2 | 8/2011 | Williams et al. |
| 8,264,216 B2 | 9/2012 | Marten |
| 8,920,026 B2 | 12/2014 | Lazarov et al. |
| 2003/0020592 A1 | 1/2003 | Hirasawa |
| 2003/0117127 A1 | 6/2003 | Male |
| 2004/0227522 A1 | 11/2004 | Male |
| 2005/0024806 A1 | 2/2005 | Hirasawa |
| 2010/0040120 A1 | 2/2010 | Sharma |
| 2012/0282500 A1 | 11/2012 | Tzivanopoulos et al. |
| 2013/0070805 A1 | 3/2013 | Coln et al. |
| 2013/0328547 A1 | 12/2013 | Marten |

FOREIGN PATENT DOCUMENTS

| | | |
|---|---|---|
| DE | 102004062655 A1 | 7/2006 |
| EP | 0605800 A1 | 7/1994 |
| EP | 1030185 A2 | 8/2000 |
| EP | 1253430 A1 | 10/2002 |
| EP | 1363131 A1 | 11/2003 |
| FR | 2883380 A1 | 9/2006 |
| WO | 9717616 A1 | 5/1997 |
| WO | 2006069745 A1 | 7/2006 |

OTHER PUBLICATIONS

English-language abstract for EP 0 605 800 A1.
English-language abstract for EP 1 030 185 A2.
English-language abstract for EP 1 253 430 A1.
English-language abstract for EP 1 363 131 A1.
English-language abstract for FR 2 883 380 A1.
English-language abstract for WO 97/17616 A1.
English-language abstract for WO 2006/069745 A1.
International Search Report for PCT/EP2011/000170 dated Jun. 1, 2011.

ELECTRONIC COMPONENT, IN PARTICULAR CURRENT SENSOR

BACKGROUND OF THE INVENTION

The invention refers to an electronic component, in particular a current sensor.

These types of current-sense resistors are known, for example from EP 0 605 800 A1 and EP 1 253 430 A1, and allow measurement of an electrical current according to the four-wire technology. In this case, the electrical current to be measured is passed via two contacts through the current-sense resistor while the electrical voltage is measured via two further contacts, which drops over the resistance element of the current-sense resistor. From the voltage measured it is then possible, by applying Ohm's law, to calculate the electrical current which flows through the current-sense resistor.

From EP 1 253 430 A1 it is furthermore known that a measurement value recording system in the form of an ASIC (ASIC: Application Specific Integrated Circuit) is directly arranged on a current-sense resistor so that the current-sense resistor forms a current sense module together with the ASIC. Current measurement using this type of current sense modules offers the advantage of very precise measurement and a low construction size; however, such current sense modules are expensive and are therefore only used for precision applications where a high precision of measurement is important.

In the industrial area there are numerous applications (for example current limit switches, electronic fuses, and others), for which it is only necessary to have a monitoring function in place, whereas the precision of measurement is less important. For some applications it is even desirable that the current measurement only reacts slowly to changes in the current to be measured in order to avoid excessively frequent switching off due to short-term current peaks. It can therefore be desirable that the current measurement reacts to a change in the current to be measured according to a time constant which is in the range of seconds. Furthermore, it should also be possible to measure both a direct current and an alternating current, such as a 50 Hertz alternating current, an alternating current strongly distorted by switching operations, or even a high-frequency alternating current.

Reference is also made to U.S. Pat. No. 3,026,363 concerning the prior art. This patent discloses a component for measurement of the temporal average of an electrical signal, such as a broadband signal. Here there is indeed a temperature measurement made by means of a thermoelement but the temperature difference between the resistance element and its connection parts is not measured.

Furthermore, a current-sense resistor is known from DE 10 2004 062 655 A1 for which the heating up of the current-sense resistor and the resultant change in the resistance value is taken into account in order to avoid temperature-dependent measurement errors. In this regard too, however, the temperature difference between the resistance element and its connection parts is not measured. This patent application therefore just discloses temperature compensation for a current-sense resistor.

Finally, regarding the general technical background, one is referred to US 2004/0227522 A1 and US 2010/0040120 A1.

The object of the invention is therefore to create another option for current measurement which is less costly to produce and also, preferably, avoids the above-mentioned disadvantages.

This object is achieved by a current sensor according to the invention.

SUMMARY OF THE INVENTION

The invention is based on the technical insight that a temperature difference arises when operating a current sensor between the resistance element made out of a resistance material on the one hand and the neighboring connection parts made out of a conductor material on the other hand. This temperature difference is due to the fact that the resistance material of the resistance element is generally of a higher impedance than the conductor material of the connection parts so that an appropriately larger thermal power loss occurs in the resistance element generating heat, which is thermally removed through the connection parts. This temperature difference between the resistance element on the one hand and the connection parts on the other hand, in turn depends on the size of the electrical current, which flows through the resistance element, so that this temperature difference constitutes a measure for the electrical current.

The invention therefore provides a temperature measuring device, which measures the temperature difference between the resistance element on the one hand and at least one of the two connection parts on the other hand in order to derive the electrical current to be measured from this. It is necessary to mention here that the temperature measuring device is meaningfully galvanically separated from the connection parts and the resistance element.

In a preferred exemplary embodiment of the invention, consisting of the temperature sensors and the evaluation circuit, the temperature measuring device has at least one thermoelement electrically insulated from a shunt with a hot contact point and a cold contact point, wherein the hot contact point thermally contacts the resistance element while the cold contact point thermally contacts one of the two connection parts. The thermoelement generates a thermoelectric voltage in an energized condition of the current sensor according to the Seebeck Effect, wherein the measured thermoelectric voltage constitutes the temperature difference and, therefore, a measure of the electrical current. Thus the thermoelement has elements, which are preferably aligned in the current sensor parallel to the direction of the current, so that the hot contact point lies on the resistance element while the cold contact point lies one of the connection parts.

In the preferred exemplary embodiment of the invention, the temperature measuring device has a thermopile with a number of thermoelements which are electrically connected in series. This offers the advantage that also relatively low temperature differences between the resistance element on the one hand and the connection parts on the other lead to a metrologically evaluatable thermoelectric voltage, since the thermoelectric voltages from the individual thermoelements add together within the thermopile.

In this connection, the thermopile is preferably arranged in such a way that the cold contact points of the thermoelement alternately contact the first connection part and the second connection part thermally. It is, however, possible as an alternative, that the cold contact points of the thermoelement of the thermopile continuously thermally contact only the first connection part or only the second connection part.

The concept of thermal contacting used within the framework of the invention requires that the respective contact points are attached to the resistance element or the connection part in such a way that there is a low heat transfer resistance. For example, this thermal contacting can occur in such a way that the hot or the cold contact points are firmly glued onto the resistance element or the connection parts using a heat conductive adhesive. One other option for thermal contacting is to firmly solder the hot or the cold contact points to the resistance element or the connection parts using an electrically insulating carrier. However, concerning the thermal contacting of the hot or the cold contact points, the invention is not restricted to the above examples but may also be implemented in another way.

In the preferred exemplary embodiment of the invention there are two thermopiles provided electrically insulated from the shunt, wherein the hot contact points on both thermopiles each thermally contact the resistance element. On the first thermopile the cold contact points thermally contact the first connection part, whereas on the second thermopile the cold contact points thermally contact the second connection part. Thus the first thermopile measures the temperature difference between the resistance element on the one hand and the first connection part on the other hand. The second thermopile, on the other hand, measures the temperature difference between the resistance element and the second connection part.

In one variant of this exemplary embodiment both of these thermopiles are connected together on the component to form a series connection and are connected with two common contacts on the component. Therefore, the thermoelectric voltage dropping over both contacts mirrors the sum of both temperature differences between the resistance element and both connection parts.

In another variant of this exemplary embodiment, both thermopiles are, on the other hand, each connected with two contacts electrically separated from each other on the component and also separate from each, in order to measure the thermoelectric voltages of both thermopiles separately from each other. This is then advantageous if a direct current is measured and the conductor material of the connection parts is not thermoelectrically adapted to the resistance material of the resistance element. In this case, an asymmetrical temperature distribution arises from the resistance element to both connection parts in the current sensor due to the Peltier Effect. The direction of the current can be derived from the difference of the thermoelectric voltages of both thermopiles, whereas the absolute value of the sum of both thermoelectric voltages constitutes a measure of the size of the electrical current to be measured.

It was already mentioned above that the hot contact points of the thermoelements thermally contact the resistance element since the resistance element in an energized condition is hotter than the neighboring connection parts due to its larger specific electrical resistance. In this case, the hot contact points of the thermoelement can lie next to each other in a row, wherein the row of hot contact points can run essentially transverse to the direction of the current in the electronic component.

The temperature inside the resistance element is, however, usually not spatially constant, but instead drops from a so-called "hot spot" in the middle of the resistance element in the direction of the neighboring connection parts. Furthermore, the temperature of the resistance element is also not constant in the lateral direction with reference to the direction of the current, but drops from the middle of the resistance element to the exposed edges. It can therefore be advantageous if the hot contact points are arranged in such a way that they are distributed spatially over the resistance element so that the thermopile measures an average value of the temperature of the resistance element, whereby the measurement can be improved.

Indirect measurement of a current by means of a temperature measurement usually is a relatively slow method of measurement, which can be advantageous for certain applications in order to avoid unnecessarily frequent switching off due to short-term current peaks. Therefore, the temperature measuring device reacts to a temporal change in the electrical current and, therefore, also the temperature difference according to a certain first time constant, wherein the first time constant is greater than 0.5 s, 1 s, 2 s, 5 s or even 10 s. However, with regard to the time constants for the temperature measuring device, the invention is not restricted to the above-stated example values but can be also realized with other time constants.

In order to improve the temporal dynamics of the current measurement there is also the possibility, as part of the invention, that the temporal change in the measured temperature difference is evaluated instead of or in addition to the absolute value of the measured temperature difference so that, for example, a statement can already be obtained about the current after just 0.3-0.5 seconds. This evaluation of the temporal change in the measured temperature difference is very suitable for monitoring for short circuits in an electrical circuit.

It should also be mentioned that the temperature measuring device is constructionally integrated in the preferred exemplary embodiment into the electronic component. To do this, the temperature measuring device can, for example, have a printed circuit board, which is fastened to the connection part and/or to the resistance element, wherein the printed circuit board carries the thermopiles. Alternatively, however, there is also the possibility that the thermopiles are attached directly onto the surface of the component, wherein the thermopiles are electrically separated from the component.

Furthermore, within the framework of the invention, there is also the possibility that the temperature measuring device also has an evaluation unit in addition to the thermopile, which determines the electrical current, which flows through the electronic component based on the measured temperature difference. This evaluation unit can, for example, be realized as an ASIC or in some other way.

In one exemplary embodiment of the invention the electronic component not only has a temperature measuring device but also a controllable switching element, wherein the switching element is connected with the temperature measuring device and switches depending on the measured temperature difference. In the preferred exemplary embodiment of the invention the switching element disconnects an electrical circuit if the measured temperature difference shows that the electrical current flowing through the current sensor has exceeded a prescribed maximum value. The switching closes the electrical circuit again if the temperature difference measured by the temperature measuring device goes below a prescribed minimum value. In this case, a switching hysteresis can be provided in such a way that the maximum value is greater than the minimum value. Resetting of the switching element can also take place by hand, however.

It was already mentioned above that the electrical current flowing through the current sensor can also be measured by means of a voltage measurement according to the known four-wire technology. In a preferred exemplary embodiment of the invention there is also provision for a voltage measurement unit, which measures the electrical voltage, which drops over the resistance element in order to allow for derivation of the electrical current. In this way, the current measurement takes place using two different measuring principles, namely, on the one hand, measurement of the temperature difference between the resistance element and the neighboring connection parts and, on the other hand, by means of a voltage measurement according to the known four-wire technology. This offers the advantage of a redundancy for the current measurement.

The voltage measurement unit for measurement of the voltage, which drops over the resistance element is preferably constructionally integrated into the electronic component so that the component together with the voltage measurement unit and/or the temperature measuring device forms a current sense module. To this effect, the voltage measurement unit can have a printed circuit board, which is fastened to the connection part and/or to the resistance element, wherein the printed circuit board can, for example, have an ASIC as described in patent application EP 1 253 430 A1 or in EP 1 363 131 A1 mentioned above. Furthermore, the voltage measurement unit has two voltage tapping points, which are connected electrically with both connection parts in order to measure the voltage, which drops over the resistance element.

In the preferred exemplary embodiment of the invention, the voltage measurement unit on the one side and the temperature measuring device on the other side are arranged on opposing sides of the electronic component. In this connection the temperature measuring device with the thermopile is preferably arranged on the underside of the current sensor, that is on the assembly side, on which the current sensor can be attached, according to the surface mounting technology (SMD: Surface Mounted Device), to a printed circuit board. The voltage measurement unit, on the other hand, is preferably arranged on the upper side of the current sensor, that is on the side opposite the assembly side.

It should also be mentioned that the current measurement is temporally significantly more dynamic according to the four-wire technology than the current measurement through measurement of the temperature difference between the resistance element and the neighboring connection parts. Thus, the voltage measurement unit reacts according to a certain second time constant to a temporal change of the electrical current flowing through the electronic component, wherein the second time constant is smaller than the first time constant of the temperature measuring device. For example, the second time constant of the voltage measurement unit can be less than 100 ms, 50 ms, 20 ms or 10 ms.

In an advantageous development of the invention the thermoelectric voltage generated by the thermopile is not only evaluated as a measurement parameter but also used for power supply. In another development of the invention there is a power supply unit provided, which supplies the temperature measuring device, the voltage measurement unit, the evaluation unit and/or the controllable switching element with the electrical power required for operation, wherein the power supply unit is fed by the thermopile so that no external power supply is needed. In order to achieve an adequately high supply voltage the thermopile can have more than 20, 50, 100, 200, 500 or even more than 1000 thermoelements and make an output voltage of more than 50 mV, 100 mV or even more than 200 mV available.

In general terms, the invention also encompasses the general principle of having redundant current measurement using a measurement value recording system, wherein the measurement value recording system measures the electrical current flowing through the electronic component according to different physical measuring principles such as a four wire measurement of current and voltage, on the one hand, and through measurement of the temperature difference between the resistance element and the neighboring connection parts on the other hand. This general principle of having redundant current measurement can, however be realized using other measuring principles.

In the preferred exemplary embodiment of the invention the connection parts and/or the resistance element are plate-shaped, in particular in a planar or bent form. Alternatively, however, there is also the possibility that the component is formed using a convex or round material or one of another shape or is formed from pieces of pipe. Furthermore, the connection parts are preferably welded to the resistance element, in particular by means of electron beam welding. The individual current-sense resistors can therefore be cut out of a so-called Tri-Band, wherein the Tri-Band can consist of two outer lying copper strips, which are electron beam welded with Manganin® strips lying in the middle. This type of manufacture of the current sensor from a composite material is very inexpensive, as is explained in detail in EP 0 605 800 A1.

It should also be mentioned that the conductor material of the connection parts has a smaller specific electric resistance than the resistance material of the resistance element. For example, the conductor material of the connection parts can have a specific electric resistance of less than $5 \cdot 10^{-7}$ Ωm, $2 \cdot 10^{-7}$ Ωm, $1 \cdot 10^{-7}$ Ωm, $5 \cdot 10^{-8}$ Ωm or even $2 \cdot 10^{-8}$ Ωm. On the other hand, the resistance material of the resistance element is low-ohmic, in particular with a specific electrical resistance of less than $50 \cdot 10^{-7}$ Ωm, $20 \cdot 10^{-7}$ Ωm, $10 \cdot 10^{-7}$ Ωm or even $5 \cdot 10^{-7}$ Ωm. The resistance material does, however, have a higher impedance than the conductor material with a specific electrical resistance of more than $10 \cdot 10^{-8}$ Ωm, $20 \cdot 10^{-8}$ Ωm, $50 \cdot 10^{-8}$ Ωm, $10 \cdot 10^{-8}$ Ωm, $10 \cdot 10^{-7}$ Ωm or $20 \cdot 10^{-7}$ Ωm.

The resistance material of the resistance element is preferably a resistance alloy, in particular copper-manganese-nickel, in particular Cu84Ni4Mn12 (Manganin®), nickel-chromium, nickel-chromium-aluminum-silicone, copper-nickel, nickel-iron, copper-nickel-manganese or copper-nickel.

It should also be mentioned that the resistance material of the resistance element preferably has a high temperature constancy concerning its specific electrical resistance. For example, the linear temperature coefficient of the resistance material can be less than $1 \cdot 10^{-3} K^{-1}$, $0.5 \cdot 10^{-3} K^{-1}$, $0.2 \cdot 10^{-3} K^{-1}$, $0.1 \cdot 10^{-3} K^{-1}$, $0.05 \cdot 10^{-3} K^{-1}$ or $0.03 \cdot 10^{3} K^{-1}$.

Furthermore, it should also be mentioned that the resistance material of the resistance element has a different thermoelectric power in the thermoelectric potential series than the conductor material of the connection parts so that the measurement using thermoelements generates a respective thermoelectric voltage.

Furthermore, the resistance material of the resistance element usually has a lower thermal conductivity than the conductor material of the connection parts, so that the temperature in the connection parts drops more slowly outwards than in the resistance element itself. For example the thermal conductivity of the resistance material of the resistance element can lie in the range of 20 $Wm^{-1}K^{-1}$ up to 500 $Wm^{-1}K^{-1}$.

BRIEF DESCRIPTION OF THE DRAWINGS

Other advantageous developments of the invention are explained in more detail below together with the description of the preferred exemplary embodiments of the invention on the basis of the figures. The figures show as follows.

DETAILED DESCRIPTION OF PREFERRED EMBODIMENTS

Figure 1:
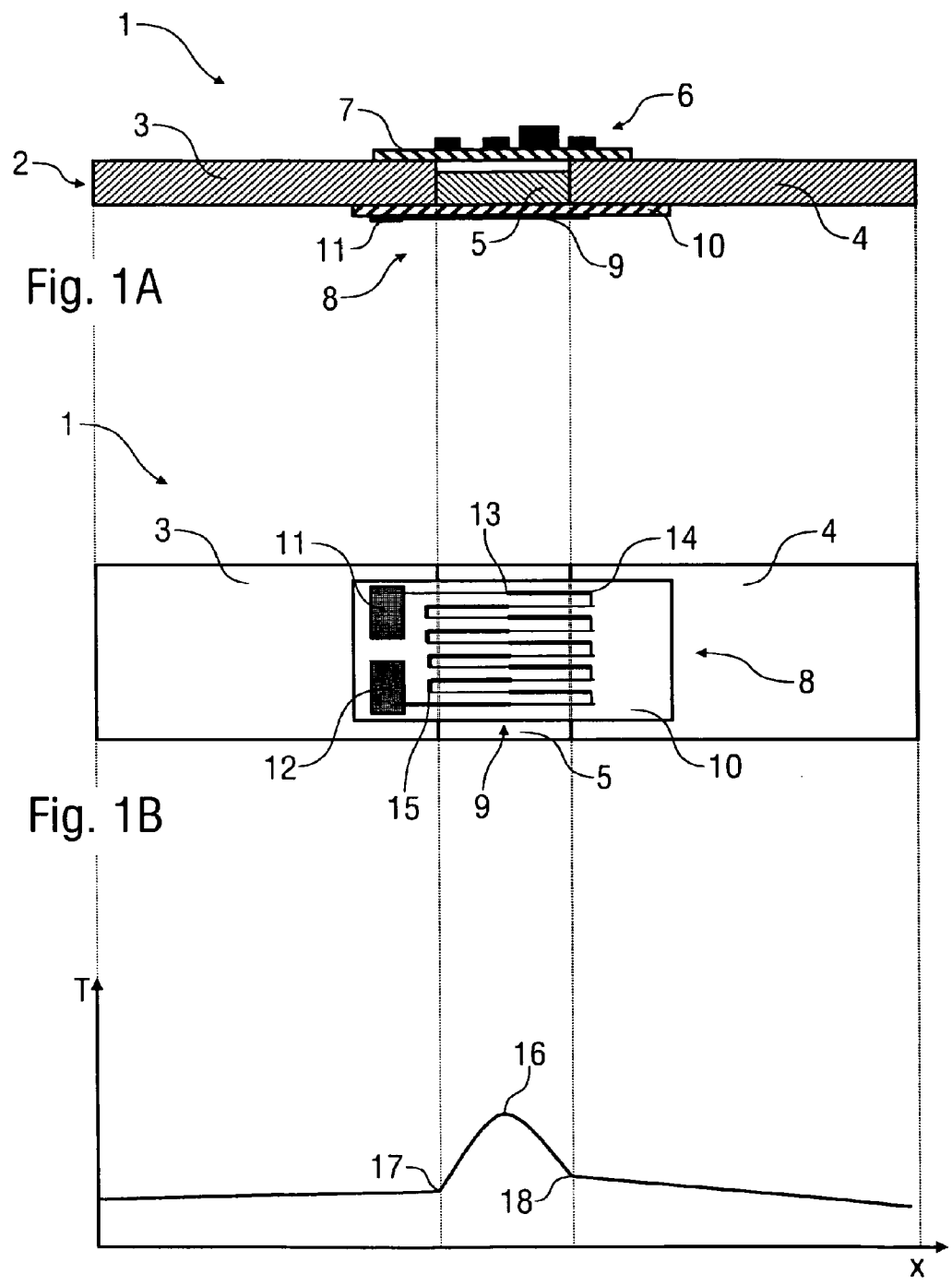
FIG. 1A a cross-sectional view of a current-sense module according to the invention, FIG. 1B a bottom view of the current sense module according to FIG. 1A from the assembly side, FIG. 1C the temperature curve in the current sense module according to FIGS. 1A and 1B in the direction of the current, FIG. 2 a bottom view of a modification to the current sense module from FIGS. 1A-1C with two separate contactable thermopiles, FIG. 3 a modification to the current sense module according to FIG. 2 with two thermopiles electrically connected in series, FIG. 4 the thermoelectric voltage curve as a function of the electrical current flowing through the current sense module, FIG. 5 the speed of change of the output voltage for various electrical currents, as well as FIG. 6 a simplified schematic circuit diagram of a novel current sense module.

FIGS. 1A and 1B show a current sense module 1 according to the invention for measurement of an electrical current in an electrical circuit, such as in a motor vehicle on-board electrical system.

The current sense module 1 has a current-sense resistor 2, which consists of two plate-shaped connection parts 3, 4 made out of copper or a copper alloy and a plate-shaped resistance element 5 made out of Manganin®, wherein the current-sense resistor 2 is cut out of a composite material strip ("Tri-Band"), which consists of two copper strips, which are electron beam welded with Manganin® strips lying in the middle, which is already known from the patent application EP 0 605 800 A1 mentioned above.

A voltage measurement unit 6 is arranged on the upper side of the current sense module 1, which voltage measurement unit essentially consists of a printed circuit board 7 and electronic components (for example an ASIC) of the printed circuit board 7, wherein the voltage measurement unit 6 is connected electrically with both connection parts 3, 4 and measures the voltage, which drops over the resistance element 5, in order, by applying Ohm's law, to calculate the electrical current, which flows through the current-sense resistor 2. The voltage measurement unit 6 can have a conventional form here, as described in the above-mentioned patent application EP 1 253 430 A1.

On the assembly side of the current sense module 1, which is the underside, there is, on the other hand, a temperature measuring device 8 attached, which has a thermopile 9, wherein the thermopile 9 is arranged on a printed circuit board 10 and has two contacts 11, 12 at which a thermoelectric voltage can be measured, which reflects the temperature difference between the resistance element 5 on the one hand and the connection parts 3, 4 on the other hand. To this effect, the thermopile 9 has hot contact points 13 and cold contact points 14, 15, wherein the hot contact points 13 thermally contact the resistance element 5 through the printed circuit board 10, whereas the cold contact points 14, 15 alternately thermally contact the connection part 3 and the connection part 4 through the printed circuit board 10. Therefore, the thermoelectric voltage dropping over the contacts 11, 12 mirrors the temperature difference between the resistance element 5, on the one hand, and the connection parts 3, 4, on the other, wherein this temperature difference constitutes a measure of the electrical current, which flows through the current-sense resistor 2.

Thus, FIG. 1C shows the temperature curve in the current-sense resistor 2 along the direction of the current. From this, it can be seen that a so-called "hot spot" 16 forms in the resistance element 5 with a particularly high temperature T, while the temperature T drops in both directions towards the connection parts 3, 4. It can furthermore be seen in the drawing that the temperature curve has at the transitions from the resistance element 5 to the connection parts 3, 4 two kinks 17, 18 in it, which kinks are due to the fact that the conductor material of the connection parts 3, 4 has a higher thermal conductivity than the resistance material of the resistance element 5.

One advantageous aspect of the current sense module 1 is the fact that the current measurement takes place redundantly, namely, on the one hand, by the voltage measurement unit 6 and, on the other hand, by the temperature measuring device 8.

Figure 2:
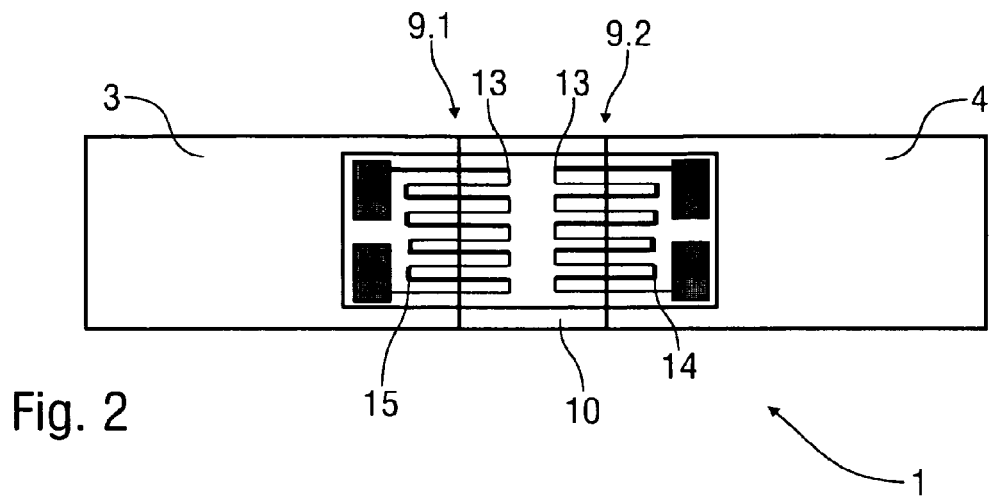

FIG. 2 shows a bottom view of a modification of the current sense module pursuant to the FIGS. 1A-1C such that, to avoid repetition, reference is made to the above-mentioned description, wherein the same reference numerals are used for the corresponding details.

A particularity of this exemplary embodiment is that the temperature measuring device 8 has two thermopiles 9.1, 9.2, which are galvanically separated from each other. The thermopile 9.1 measures the temperature difference between the resistance element 5 and the connection part 3, while the thermopile 9.2 measures the temperature difference between the resistance element 5 and the connection part 4.

The sum of both of the thermoelectric voltages, which are measured by both thermopiles 9.1, 9.2, constitutes here a measure of the size of the electrical current which flows through the current-sense resistor 2.

Furthermore, the Peltier effect causes an asymmetrical temperature distribution in the current-sense resistor 2 as can also be seen to some extent from FIG. 1C. Based on a comparison of both thermoelectric voltages, which are generated by both thermopiles 9.1, 9.2, it is also possible to determine the direction of the current.

Figure 3:
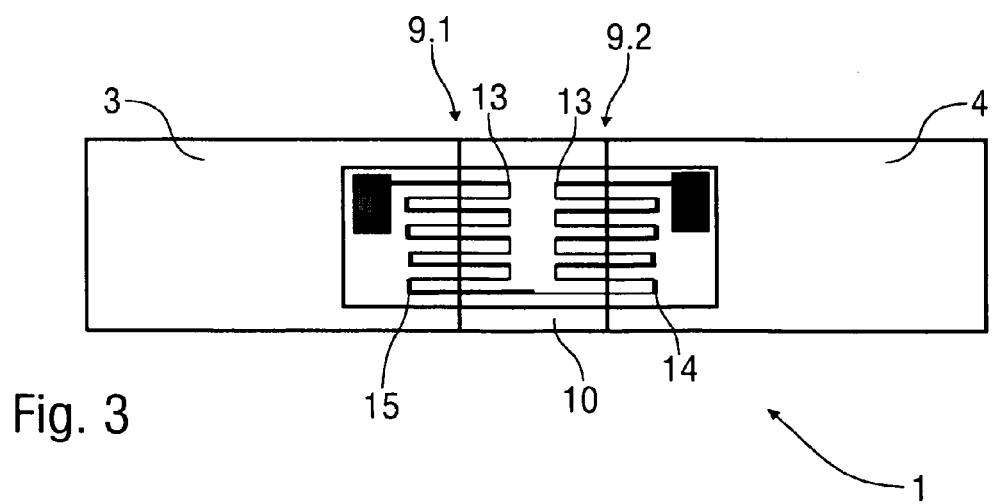

FIG. 3 shows a modification to the specimen embodiment in FIG. 2, so reference is made to the above description to avoid repetition, whereby the same numbers are used for corresponding details.

In contrast to the exemplary embodiment according to FIG. 2, both thermopiles 9.1, 9.2 are here electrically connected in series.

Figure 4:
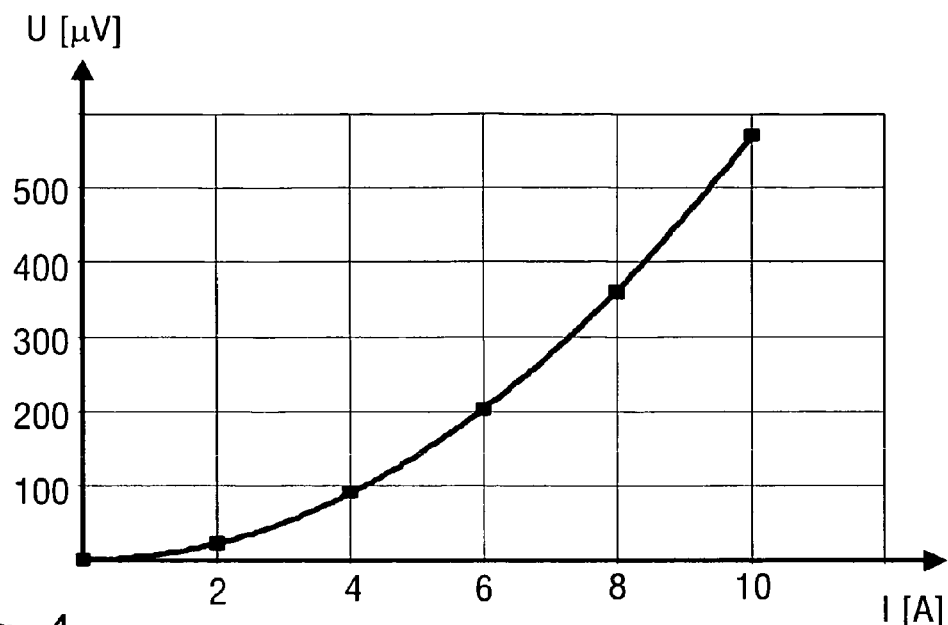

FIG. 4 shows an example of the curve for a thermoelectric voltage U as a function of an electrical current I, which flows through the current-sense resistor 2.

Figure 5:
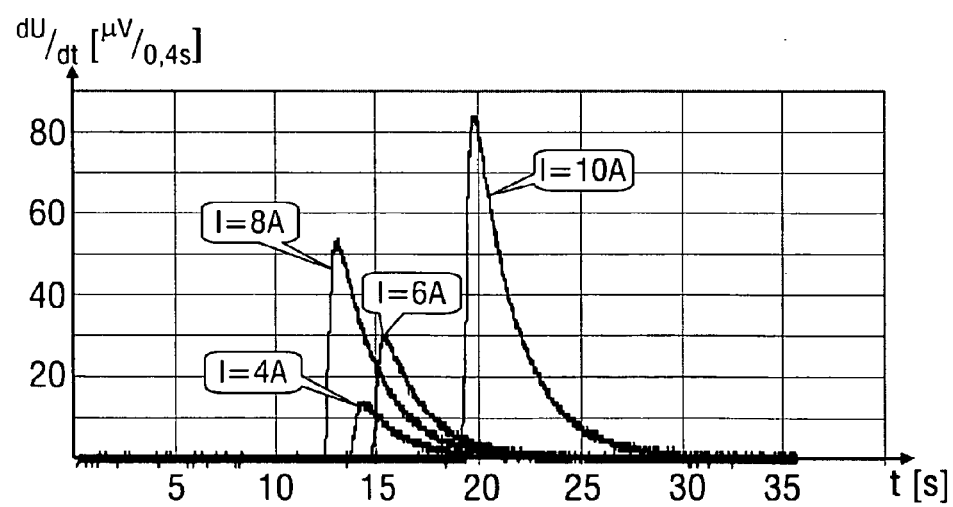

FIG. 5 shows example temporal curves for the change in speed dU/dt of the thermoelectric voltage as a function of the time expired after a change in the current.

Figure 6:
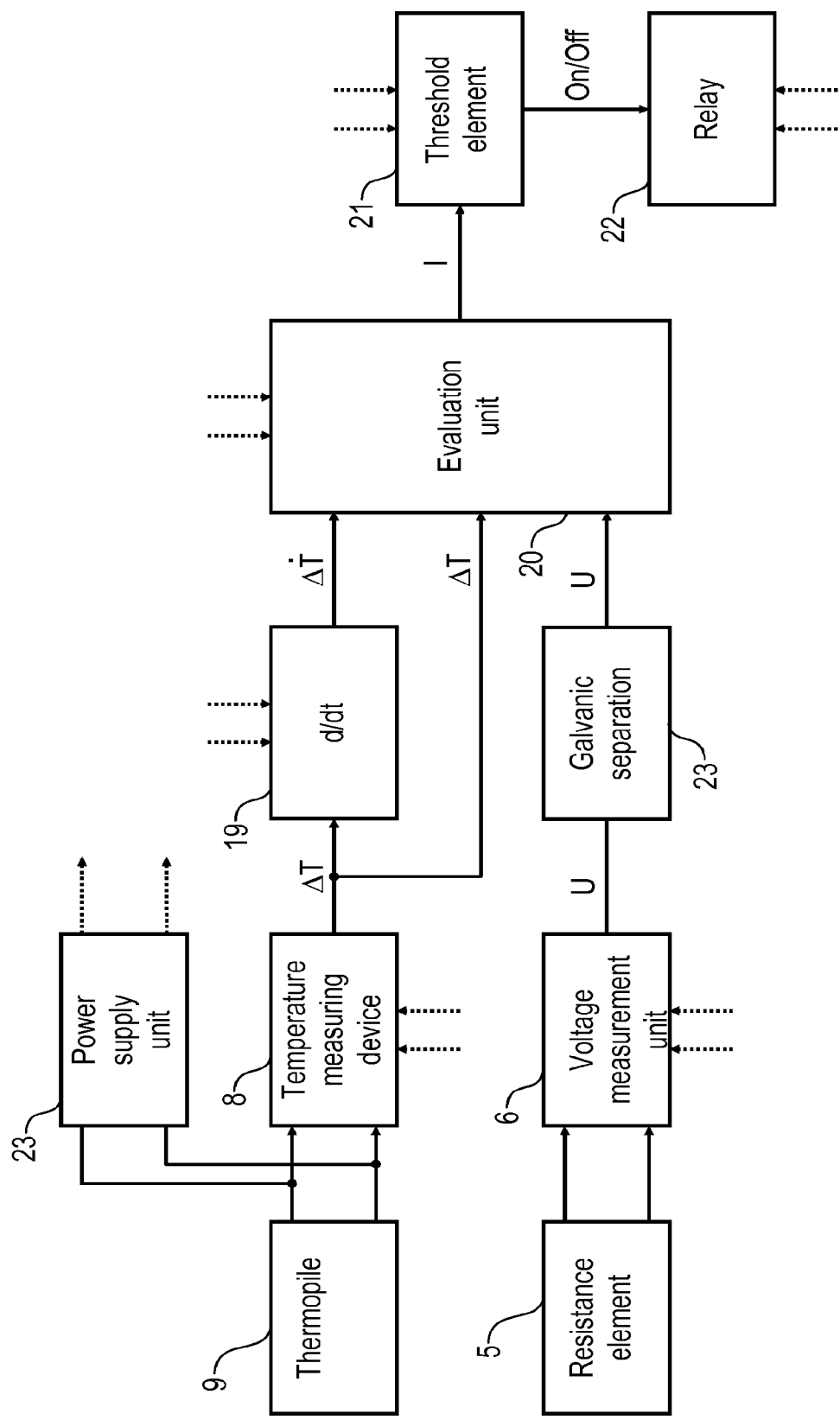

Finally, FIG. 6 shows a simplified circuit diagram of the current sense module pursuant to FIGS. 1A-1C such that, to avoid repetition, reference is made to the above-mentioned description, wherein the same reference numerals are used for the corresponding details.

In this circuit diagram, it can also be seen that a differentiator 19 is provided, which differentiator forms the time derivation $\Delta \dot{T}$ of the temperature difference $\Delta T$ measured by the temperature measuring device 8.

Furthermore, there is an evaluation unit 20 provided, which determines the electrical current I, which flows through the current-sense resistor 2. Here, the evaluation unit 20 takes account, on the one hand, of the temperature difference $\Delta T$ and the time derivation $\Delta \dot{T}$ of the temperature difference $\Delta T$ and, on the other hand, the electrical voltage U, which drops over the resistance element 5 and which is measured by the voltage measurement unit 6.

The measurement value of the electrical current I measured in this way is passed on to a threshold element 21, wherein the threshold element 21 actuates a relay 22 or some other kind of switching element. If the measured electrical current I exceeds a prescribed maximum value $I_{MAX}$, then the threshold element 21 actuates the relay 22 in such a way that the electrical circuit is disconnected in order to avoid any further increase in the current. If the electrical current I then goes below a prescribed minimum value $I_{MIN}$, the threshold element 21 actuates the relay 22 in such a way that the electrical circuit is closed again. The threshold element 21, in this case, has a switching hysteresis in order to prevent excessively frequent switching.

Finally, it should also be mentioned that the current sense module 1 has a power supply unit 23, which is fed by the thermopile 9 and supplies the temperature measuring device 8, the differentiator 19, the evaluation unit 20, the threshold element 21, the relay 22 and the voltage measurement unit 6 with the electrical power required for operation, so that the current sense module 1 does not need any external power supply.

It should furthermore also be mentioned that there is a galvanic separation 24 provided between the evaluation unit 20 and the voltage measurement unit 6.

The invention is not limited to the preferred exemplary embodiments described above. Instead, a plurality of variants and modifications are possible, which likewise make use of the concept of the invention. Furthermore, the invention also claims protection for the features of the sub-claims independently of the features of the preceding claims to which they refer so that, as part of the invention, any number of combinations of the features mentioned in the claims or in the description are possible.

LIST OF REFERENCE NUMERALS

1 Current sense module
2 Current-sense resistor
3 Connection part
4 Connection part
5 Resistance element
6 Voltage measurement unit
7 Printed circuit board
8 Temperature measuring device
9 Thermopile
10 Printed circuit board
11 Connecting contact
12 Connecting contact
13 Hot contact point
14 Cold contact point
15 Cold contact point
16 Hot spot
17 Kink point of the temperature profile
18 Kink point of the temperature profile
19 Differentiator
20 Evaluation unit
21 Threshold element
22 Relay
23 Power supply unit
24 Galvanic separation

What is claimed is:

1. An electronic component, which is a current sensor, comprising:
   a) a resistance element comprising a resistance material;
   b) a first connection part comprising a conductor material for leading an electrical current into the resistance element;
   c) a second connection part comprising a conductor material for leading the electrical current out of the resistance element, wherein the conductor material of the first and second connection parts has a smaller specific electric resistance than the resistance material of the resistance element; and
   d) a measurement value recording system, which is arranged to measure the electrical current flowing through the electronic component,
      d1) wherein the measurement value recording system is constructionally integrated into the electronic component, and
      d2) wherein the measurement value recording system is arranged to measure the electrical current flowing through the electronic component according to a number of different physical measuring principles,
      d3) wherein one of the measurement principles is a four wire measurement, wherein the electrical current to be measured is passed over two contacts through the resistance element while the electrical voltage is measured via two further contacts, which drops over the resistance element,
      d4) wherein the measurement value recording system comprises a voltage measurement unit, which measures the electrical voltage which drops over the resistance element, wherein:
         the voltage measurement unit is constructionally integrated into the electronic component;
         the voltage measurement unit has a printed circuit board, which is fastened to the connection parts and/or to the resistance element; and
         the voltage measurement unit has two voltage tapping points, which are connected electrically with both connection parts in order to measure the voltage, which drops over the resistance element.

2. The electronic component according to claim 1, wherein a further one of the measurement principles includes a measurement of at least a temperature difference between the resistance element on the one hand and one of the first and second connection parts on the other.

3. The electronic component according to claim 2, further comprising a temperature measuring device arranged for measurement of the temperature difference between the resistance element on the one hand and at least one of the first and second connection parts on the other hand.

4. The electronic component according to claim 3, wherein the temperature measuring device has at least one thermoelement with a hot contact point and a cold contact point, wherein the hot contact point thermally contacts the resistance element while the cold contact point thermally contacts one of the first and second connection parts.

5. The electronic component according to claim 4, wherein:
   a) the temperature measuring device has a thermopile with multiple thermoelements, which are electrically switched one behind another;
   b) each hot contact point of the thermoelements is thermally in contact with the resistance element; and c) cold contact points of the thermoelements are alternately thermally in contact with the first connection part and the second connection part.

6. The electronic component according to claim 5, wherein hot contact points of the thermoelements on the resistance elements lie in a row side-by-side, wherein the row of the hot contact points essentially runs transverse to a direction of the current.

7. The electronic component according to claim 5, wherein hot contact points of the thermoelements are arranged in such a way that they are distributed over the resistance element.

8. The electronic component according to claim 4, wherein:
a) the temperature measuring device has a first thermopile and a second thermopile;
b) each hot contact point of the first thermophile and the second thermopile is thermally in contact with the resistance element;
c) each cold contact point of the first thermopile is thermally in contact with the first connection part; and
d) each cold contact point of the second thermopile is thermally in contact with the second connection part.

9. The electronic component according to claim 8, wherein the first and second thermopiles on the component are switched together to form an electrical series connection and are electrically connected with two common contacts to the component.

10. The electronic component according to claim 8, wherein the first and second thermopiles on the component are electrically separated from each other and electrically separately connected respectively with two contacts in order to measure thermoelectric voltages of both thermopiles separately.

11. The electronic component according to claim 3, wherein the temperature measuring device reacts to a temporal change in the temperature difference according to a certain first time constant wherein the first time constant is greater than 0.5 s.

12. The electronic component according to claim 3, wherein the temperature measuring device determines and evaluates a temporal change in the measured temperature difference.

13. The electronic component according to claim 3, wherein the temperature measuring device is galvanically separated from the first and second connection parts and the resistance element.

14. The electronic component according to claim 3, wherein the temperature measuring device is constructionally integrated into the electronic component.

15. The electronic component according to claim 3, wherein the temperature measuring device has an evaluation unit, which determines the electrical current or an electrical output based on the measured temperature difference which flows through the electronic component.

16. The electronic component according to claim 3, wherein the temperature measuring device has a printed circuit board, which is fastened to the connection parts and/or to the resistance element.

17. The electronic component according to claim 3, further comprising a controllable switching element, wherein the switching element is connected with the temperature measuring device and is switched depending on the measured temperature difference.

18. The electronic component according to claim 17, wherein
a) the controllable switching element is a relay;
b) the switching element is electrically connected in series with the resistance element;
c) the switching element opens if the temperature difference measured by the temperature measuring device exceeds a prescribed maximum value;
d) the switching element closes if the temperature difference measured by the temperature measuring device goes below a prescribed minimum value; and
e) the switching element is constructionally integrated into the electronic component.

19. The electronic component according to claim 18, wherein:
a) the voltage measurement unit and the temperature measuring device are arranged on opposing sides of the electronic component;
b) the temperature measuring device reacts to a temporal change in the temperature difference according to a certain first time constant wherein the first time constant is greater than 0.5 s; and
c) the voltage measurement unit reacts according to a certain second time constant to a temporal change of the electrical current flowing through the electronic component, wherein the second time constant is smaller than the first time constant of the temperature measuring device.

20. The electronic component according to claim 3, wherein
a) a power supply unit is provided, which supplies the temperature measuring device with the electrical current required for operation;
b) the power supply unit is fed by the thermopile;
c) the thermopile has more than 20 thermoelements;
d) the thermopile in an energized condition of the electronic component provides an output voltage of more than 50 mV; and
e) the electronic component does not need any external power supply due to the power supply unit.

21. The electronic component according to claim 1, wherein:
a) at least one of the first and second connection parts and the resistance element are plate-shaped;
b) the first and second connection parts are welded to the resistance element;
c) the conductor material of the first and second connection parts is copper or a copper alloy;
d) the conductor material of the first and second connection parts has a specific electrical resistance of less than $5 \cdot 10^{-7}$ $\Omega$m;
e) the resistance material of the resistance element is a resistance alloy selected from the group consisting of copper-manganese-nickel, nickel-chromium, nickel-chromium-aluminum-silicone, copper-nickel, nickel-iron, copper-nickel-manganese and copper-nickel;
f) the resistance material of the resistance element is low-ohmic;
g) the resistance material of the resistance element has a high temperature constancy concerning its specific electrical resistance, with a linear temperature coefficient of less than $1 \cdot 10^{-3} K^{-1}$;
h) the resistance material of the resistance element has a different thermoelectric power in the thermoelectric potential series than the conductive material of the first and second connection parts;

i) the resistance material of the resistance element has a lower thermal conductivity than the conductor material of the first and second connection parts;
j) the thermal conductivity of the resistance material of the resistance element is less than 100 $Wm^{-1}K^{-1}$;
k) the thermal conductivity of the conductor material of the connection parts is greater than 100 $Wm^{-1}K^{-1}$; and
l) the resistance material has a higher impedance than the conductor material, with a specific electrical resistance of more than $10 \cdot 10^{-8}$ $\Omega m$.

* * * * *